(12) United States Patent
Tsai et al.

(10) Patent No.: US 7,696,028 B2
(45) Date of Patent: Apr. 13, 2010

(54) PIXEL STRUCTURE OF A THIN FILM TRANSISTOR LIQUID CRYSTAL DISPLAY

(75) Inventors: Che-Fu Tsai, Taichung (TW); Yi-Lin Chou, Taichung (TW); Wen-Chun Wang, Taichung (TW)

(73) Assignee: Wintek Corporation, Taichung (TW)

( * ) Notice: Subject to any disclaimer, the term of this patent is extended or adjusted under 35 U.S.C. 154(b) by 17 days.

(21) Appl. No.: 12/128,161

(22) Filed: May 28, 2008

(65) Prior Publication Data

US 2008/0227242 A1    Sep. 18, 2008

Related U.S. Application Data

(62) Division of application No. 11/341,464, filed on Jan. 30, 2006, now Pat. No. 7,592,627.

(51) Int. Cl.
*H01L 21/336* (2006.01)

(52) U.S. Cl. ............... 438/158; 438/149; 257/E21.414

(58) Field of Classification Search ............ 257/59, 257/72, E21.414, E21.412, E27.132; 349/113; 438/149, 158
See application file for complete search history.

(56) References Cited

U.S. PATENT DOCUMENTS

| | | | |
|---|---|---|---|
| 6,683,666 B1 * | 1/2004 | Jang et al. | 349/113 |
| 2005/0258427 A1 * | 11/2005 | Chan et al. | 257/72 |
| 2006/0154485 A1 * | 7/2006 | Li et al. | 438/692 |

* cited by examiner

*Primary Examiner*—Sue Purvis
*Assistant Examiner*—Selim Ahmed
(74) *Attorney, Agent, or Firm*—Muncy, Geissler, Olds & Lowe, PLLC

(57) ABSTRACT

A pixel structure of a thin film transistor liquid crystal display employs a design of three metal layers and includes an organic insulating layer between a data signal line and a common electrode for reducing a parasitic capacitance, while a passivation layer included between the common electrode and a pixel electrode acts as a storage capacitor required for the pixels, so as to achieve a high aperture ratio, and the common electrode can act as a shielding bar for enhancing the display contrast.

8 Claims, 14 Drawing Sheets

PIXEL STRUCTURE OF A THIN FILM TRANSISTOR LIQUID CRYSTAL DISPLAY

CROSS-REFERENCE TO RELATED APPLICATION

This application is a divisional application of U.S. patent application Ser. No. 11/341,464, filed on Jan. 30, 2006, now U.S. Pat. No. 7,592,627

BACKGROUND OF THE INVENTION

1. Field of the Invention

The present invention relates to a liquid crystal display, and more particularly to a pixel structure of a thin film transistor liquid crystal display.

2. Description of Prior Art

Liquid crystal display (LCD) becomes increasingly popular due to its low radiation and compact size, and thin film transistor LCD (TFT LCD) is a mainstream display product in the market due to its contrast and viewing angle.

Since liquid crystals are non-luminous materials, the light source of the TFT LCD is a backlight light source, and the backlight light source can pass through the materials of each layer of the TFT LCD such as a polarizer and a color filter to provide a display brightness approximately equal to 10% of the brightness of the original light source. Since such brightness is insufficient, an increase of the brightness of the backlight module can increase the brightness of the pane, which will also increase the power loss of the panel module. Although increasing the aperture ratio of a display panel will improve the display effect of the panel, finding a way of increasing the aperture ratio for pixels of the display panel is still a major research subject for display panel manufacturers.

Referring to FIG. 1 for the schematic view of a prior art pixel structure, the pixel structure includes a TFT structure 1a, a scan signal line 3a formed by a first metal conductive layer, a shielding bar 2a, and a common electrode 4a, an active region 5a, a data signal line 6a formed by a second metal conductive layer, and a pixel electrode 7a formed by a transparent conductive layer. The storage capacitor is manufactured by a common electrode 4a formed by the first metal conductive layer and an overlap region 8a corresponding to a source electrode of the TFT structure 1a. The shielding bar 2a is provided for preventing a light leak and shielding extra light of the backlight module in the LCD, so that the light sources between pixels will not interfere with each other, and the display contrast can be improved. However, in a specific area, the aperture ratio according to this design is not too high, because the overlap region 8a required for forming the storage capacitor will occupy some regions of the pixels and the shielding bar 2a will lower the aperture ratio. Such design cannot comply with the market requirements for a higher resolution of the display panel (or a smaller pixel size).

Referring to FIG. 2 for the schematic view of another prior art pixel layout, the pixel structure of this prior art is basically the same as the prior art illustrated in FIG. 1 and includes a TFT structure 1a a scan signal line 3a formed by a first metal conductive layer, a common electrode 4a, an active region 5a, a data signal line 6a formed by a second metal conductive layer, and a pixel electrode 7a formed by a transparent conductive layer, and the storage capacitor is made by a common electrode 4a formed by the first metal conductive layer and an overlap region 8a corresponding to a source electrode of the TFT structure 1a. The major difference between such design and the prior art illustrated in FIG. 1 resides on that when the second metal layer is coated, a passivation layer 11a is coated by a chemical vapor deposition process, and then coated with an organic insulating layer 10a having a low dielectric constant, and finally plated with a transparent conductive layer (such as the passivation layer 11a, the substrate 12a, and the gate insulating layer 13a illustrated in the cross-sectional view of Section C-C in FIG. 3). The purpose of producing the organic insulating layer 10a is to lower the parasitic capacitance produced by the data signal line 3a and the pixel electrode 7a to avoid the occurrence of a crosstalk. Since the structure illustrated in FIG. 2 has a higher aperture ratio than the prior art structure illustrated in FIG. 1, the pixel design requires an additional area for the storage capacitor of the pixel, and such design used in a high-resolution panel still needs further improvements.

SUMMARY OF THE INVENTION

The primary objective of the present invention is to overcome the shortcomings of the prior art by increasing the aperture ratio of pixels regardless of being applied to a high-resolution panel or a low-resolution panel, so as to improve the pixel quality and correspondingly reduce the power loss caused by improving the brightness of a backlight module.

To achieve the foregoing objective, a pixel structure of a thin film transistor liquid crystal display in accordance with the present invention comprises a substrate, a first metal conductive layer covered onto the substrate, a first insulating layer (a gate insulating layer), a hydrogenated amorphous silicon (a-Si:H) intrinsic layer and an n+Si ohmic contact film coated onto the first metal conductive layer, a second metal conductive layer and a second insulating layer coated onto the second metal conductive layer, an organic insulating layer covered onto the second insulating layer, a third metal conductive layer covered onto the organic insulating layer, a passivation layer covered onto the third metal conductive layer, and a transparent conductive layer covered onto the passivation layer, characterized in that the organic insulating layer having a low dielectric constant lowers the parasitic capacitance produced by the data signal line of the second metal conductive layer and the common electrode (Vcom) of the third metal conductive layer, while the pixel electrode comprised of the common electrode and the transparent conductive layer and including a passivation layer acts as a storage capacitor required for the pixels, and the opaque characteristic of the common electrode (Vcom) can prevent light leaks and shield extra light of the backlight module in the LCD, such that the light sources between pixels will not interfere with each other, so as to enhance the display contrast.

BRIEF DESCRIPTION OF DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
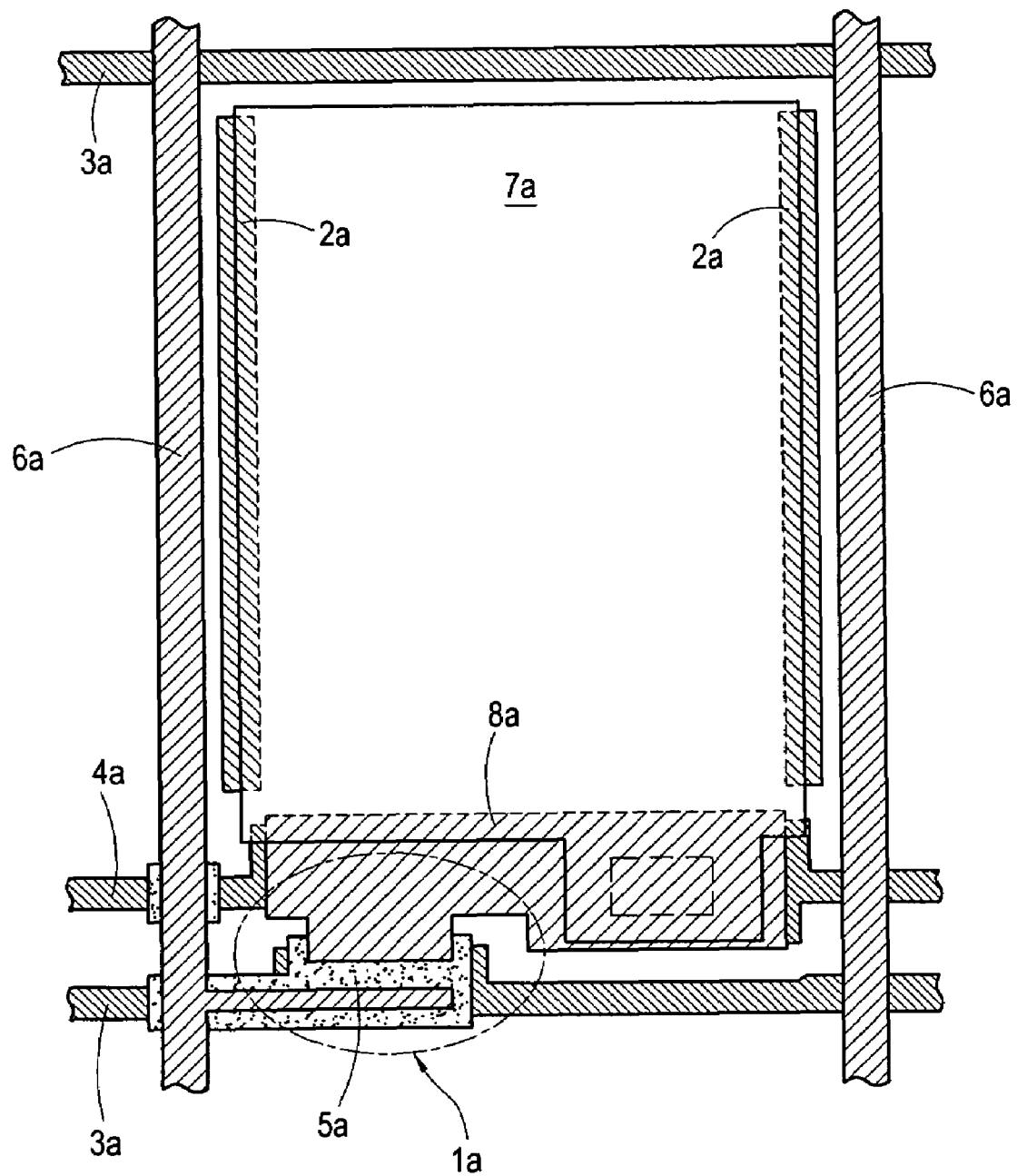
FIG. 1 is a schematic view of a prior art pixel layout.
Figure 2:
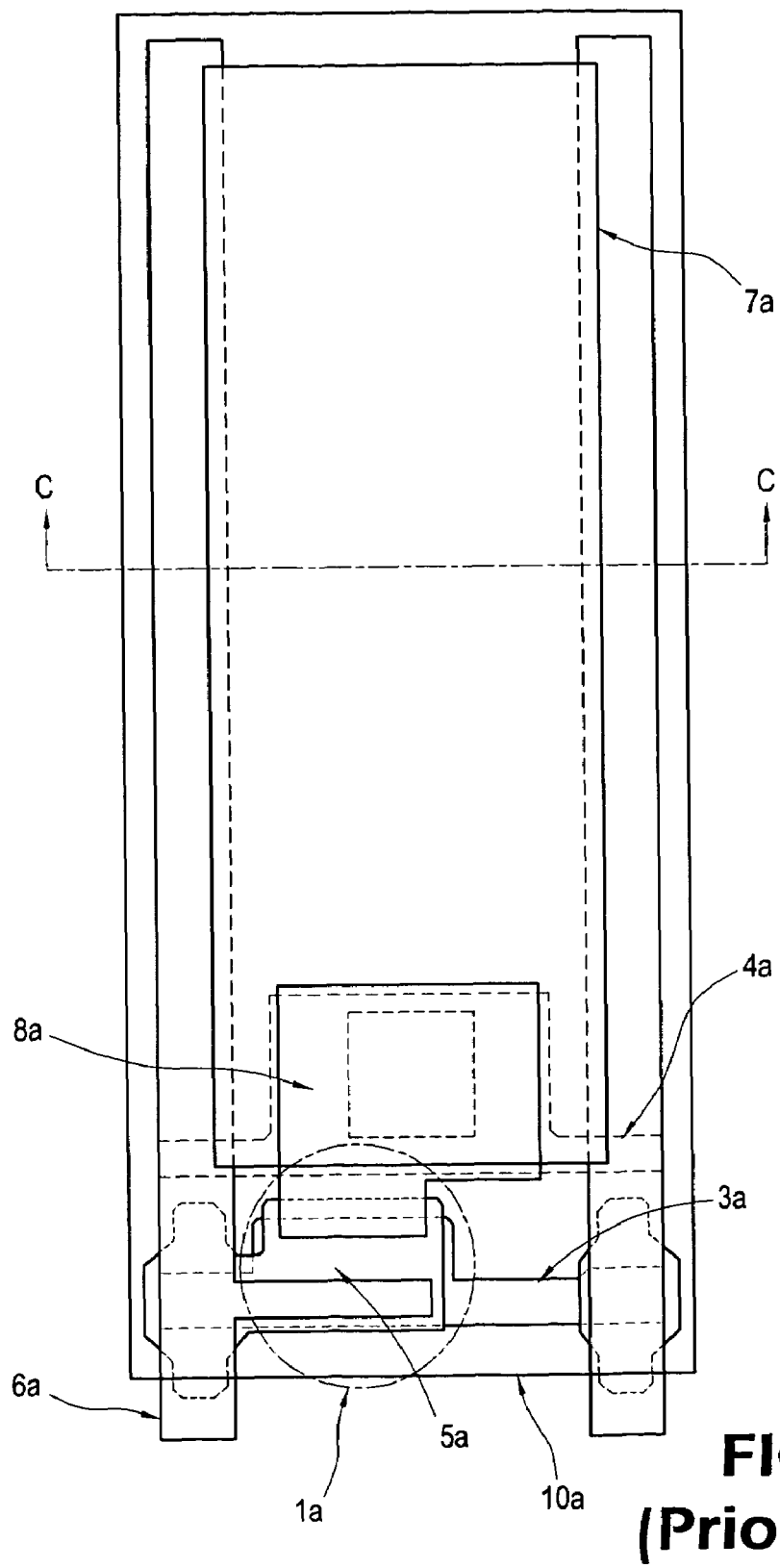
FIG. 2 is a schematic view of another prior art pixel layout.
Figure 3:
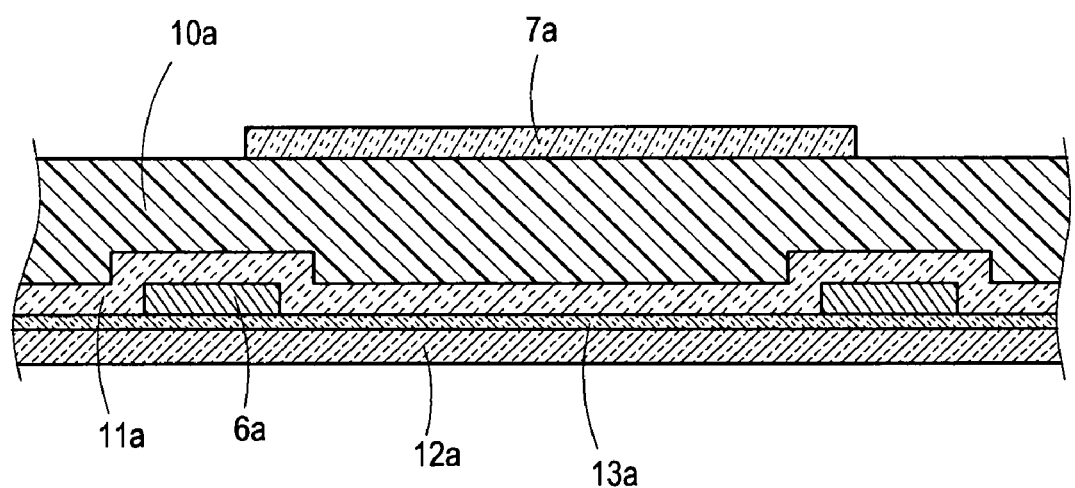
FIG. 3 is a cross-sectional view of Section C-C as depicted in FIG. 2.

The technical characteristics, features and advantages of the present invention will become apparent in the following detailed description of the preferred embodiments with reference to the accompanying drawings.

Referring to FIGS. 4 to 19 for the manufacturing flow of a pixel structure of a liquid crystal display according to a preferred embodiment of the present invention, the pixel structure of a thin film transistor liquid crystal display of the invention increases the pixel aperture ratio to improve the brightness and the display quality of the display panel and enhance product competitiveness.

The pixel structure of a thin film transistor liquid crystal display in accordance with the invention comprises: a TFT structure 9, a scan signal line 11 formed by a first metal conductive layer, an active region 10, a data signal line 3 formed by a second metal conductive layer, a common electrode 6 of a third conductive layer, a pixel electrode 101 of a transparent conductive layer, and a second insulating layer 4, and the pixel structure of the invention is manufactured as follows:

Firstly, a substrate 1 is prepared, wherein the substrate 1 is made of a hard material (such as glass) or a soft material (such as plastics).

Figure 4:
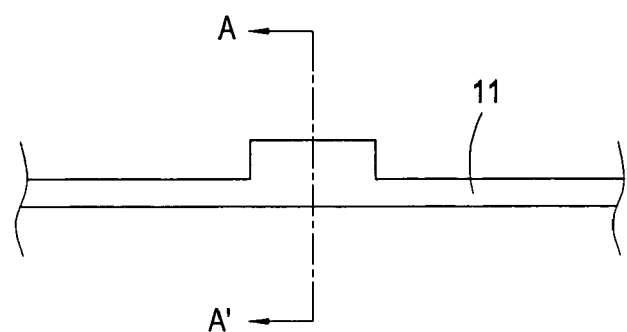
FIG. 4 is a schematic view of a structural layout of the present invention.
Figure 5:
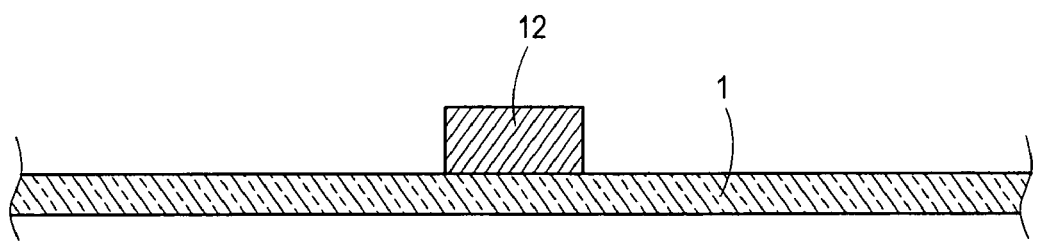
FIG. 5 is a cross-sectional view of Section A-A' as depicted in FIG. 4.

A coating equipment is used to coat a first metal conductive material onto a surface of the substrate 1 to produce a first metal conductive layer (FIG. 4 shows its structural layout and FIG. 5 shows the cross-sectional view of the structure at Section A-A' as depicted in FIG. 4). The first metal conductive layer forms a gate electrode 12 of a TFT structure and a scan signal line 11 of a pixel, wherein the first metal conductive layer is made of any of molybdenum (Mo), tantalum (Ta), chromium (Cr), tungsten (W), aluminum, and aluminum alloy or any combination of the above, or made of a multilayer as needed.

Figure 6:
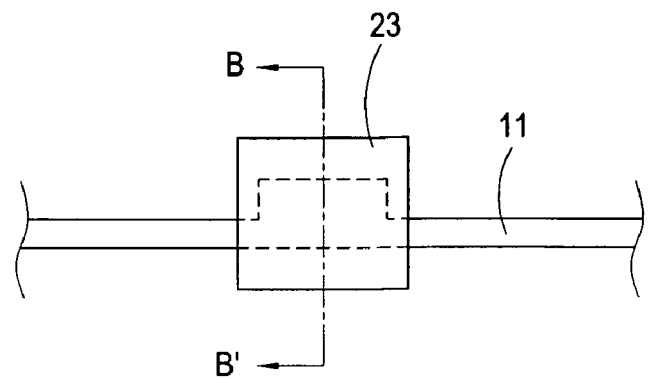
FIG. 6 is a schematic view of a structural layout of the present invention.
Figure 7:
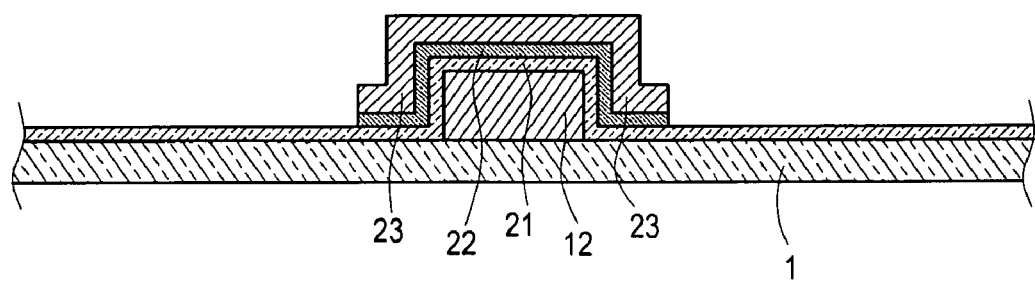
FIG. 7 is a cross-sectional view of Section B-B' as depicted in FIG. 6.

The first metal conductive layer at its surface forms a first insulating layer 21 (such as a nitrogen silicon (SiNx) and a semiconductor layer (FIG. 7 shows the structure at Section B-B' as depicted in FIG. 6), wherein the film formation of the semiconductor layer is conducted successively by a plasma enhanced chemical vapor deposition (PECVD) equipment to coat a hydrogenated amorphous silicon (a-Si:H) intrinsic layer 22 and an n+Si ohmic contact film 23. Since the a-Si:H intrinsic layer 22 and the SiNx first insulating layer 21 are coated successively, therefore the invention can obtain a better interface between the SiNx and the a-Si:H semiconductor film.

Figure 8:
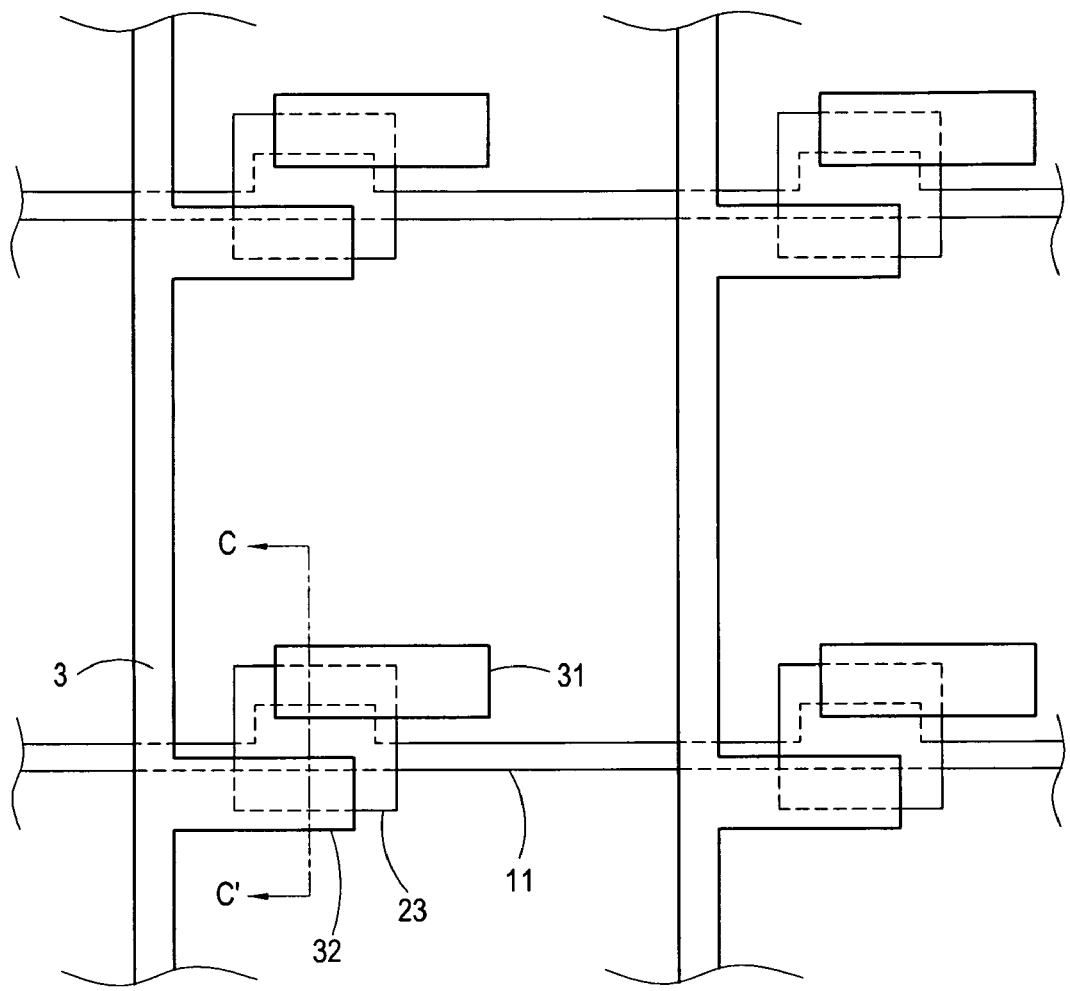
FIG. 8 is a schematic view of a structural layout of the present invention.
Figure 9:
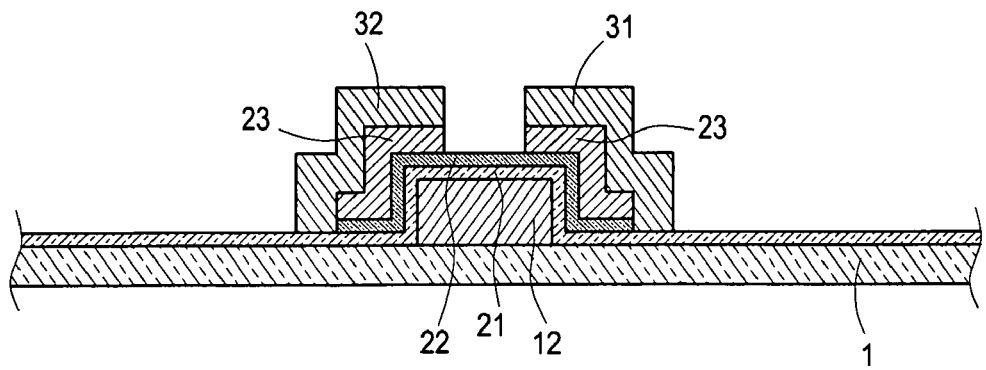
FIG. 9 is a cross-sectional view of Section C-C' as depicted in FIG. 8.
Figure 10:
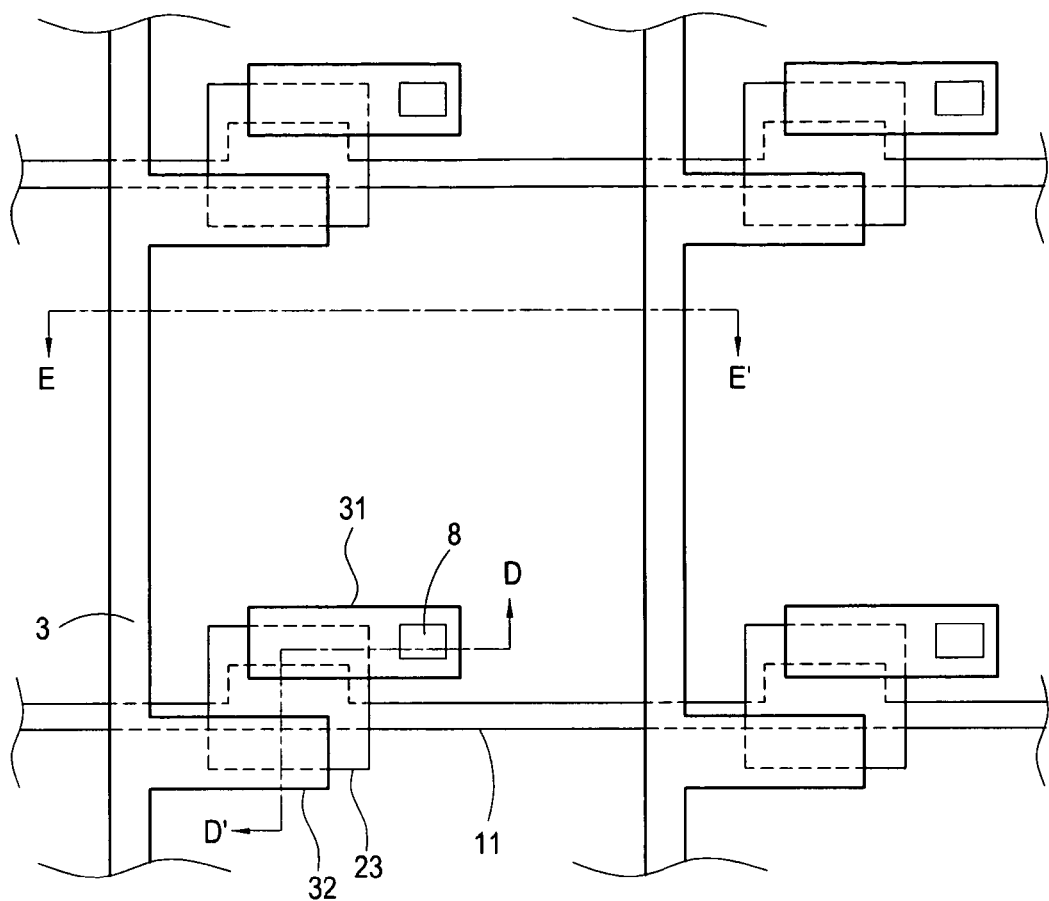
FIG. 10 is a schematic view of a structural layout of the present invention.

A pattern of the semiconductor layer required for the thin film transistor is formed by a yellow light process (as shown in FIGS. 8 and 9), and a second metal conductive layer is plated onto a surface of the n+Si ohmic contact film 23 by a splattering process (FIG. 8 shows its structural layout), and the patterns of a drain electrode 32, a source electrode 31, and a data signal line 3 of the thin film transistor are formed by a yellow light process, and an n+Si ohmic contact film 23 is etched at a tunnel end in an opposite direction by a dry etching method (FIG. 9 shows the structure at Section C-C' as depicted in FIG. 8), and then a thin film process is applied on the drain electrode 32, source electrode 31, and data signal line 3 to deposit a second insulating layer 4 by a chemical vapor deposition process (FIG. 10 shows the schematic view of its structural layout).

Figure 11:
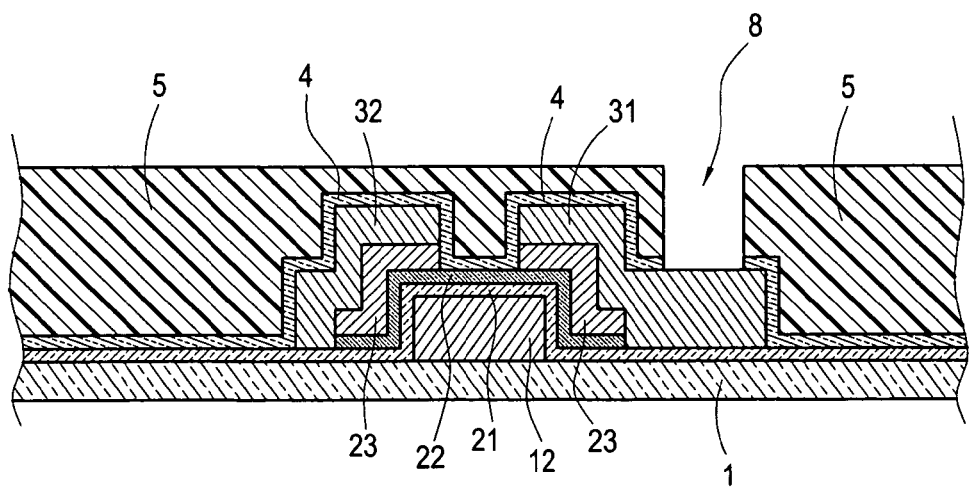
FIG. 11 is a cross-sectional view of Section D-D' as depicted in FIG. 10.
Figure 12:
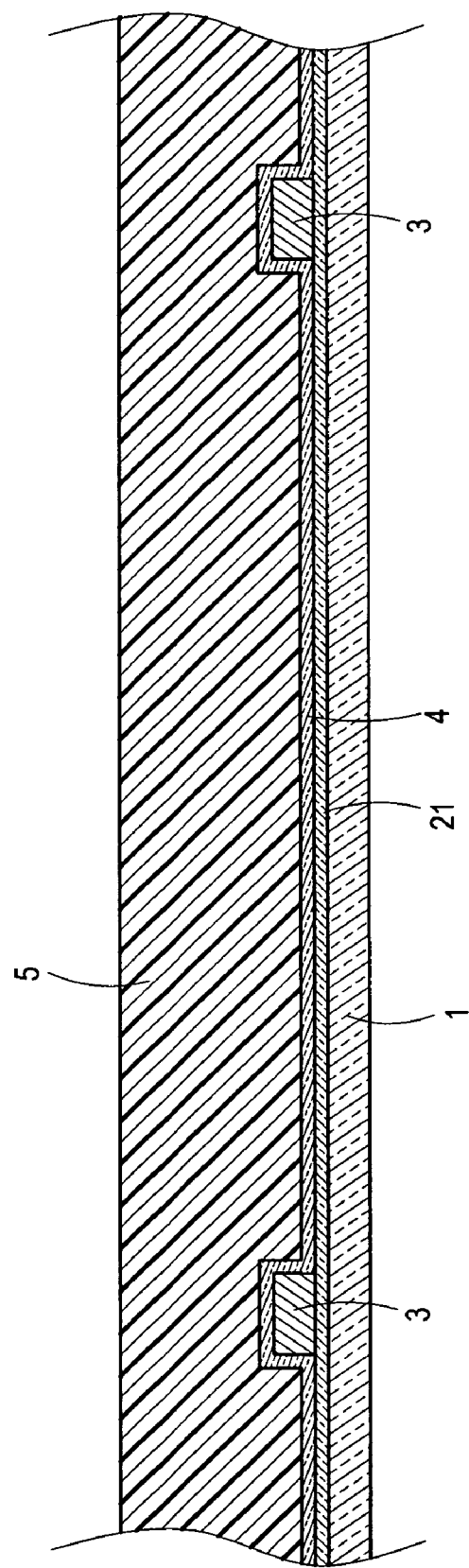
FIG. 12 is a cross-sectional view of Section E-E' as depicted in FIG. 10.

After the second insulating layer 4 is formed, an organic insulating layer 5 is coated onto a surface of the second insulating layer 4 by a spin coater (FIG. 11 shows the cross-sectional view of the structure at Section D-D' as depicted in FIG. 10 and FIG. 12 shows the cross-sectional view of the structure at Section E-E' as depicted in FIG. 10).

Figure 13:
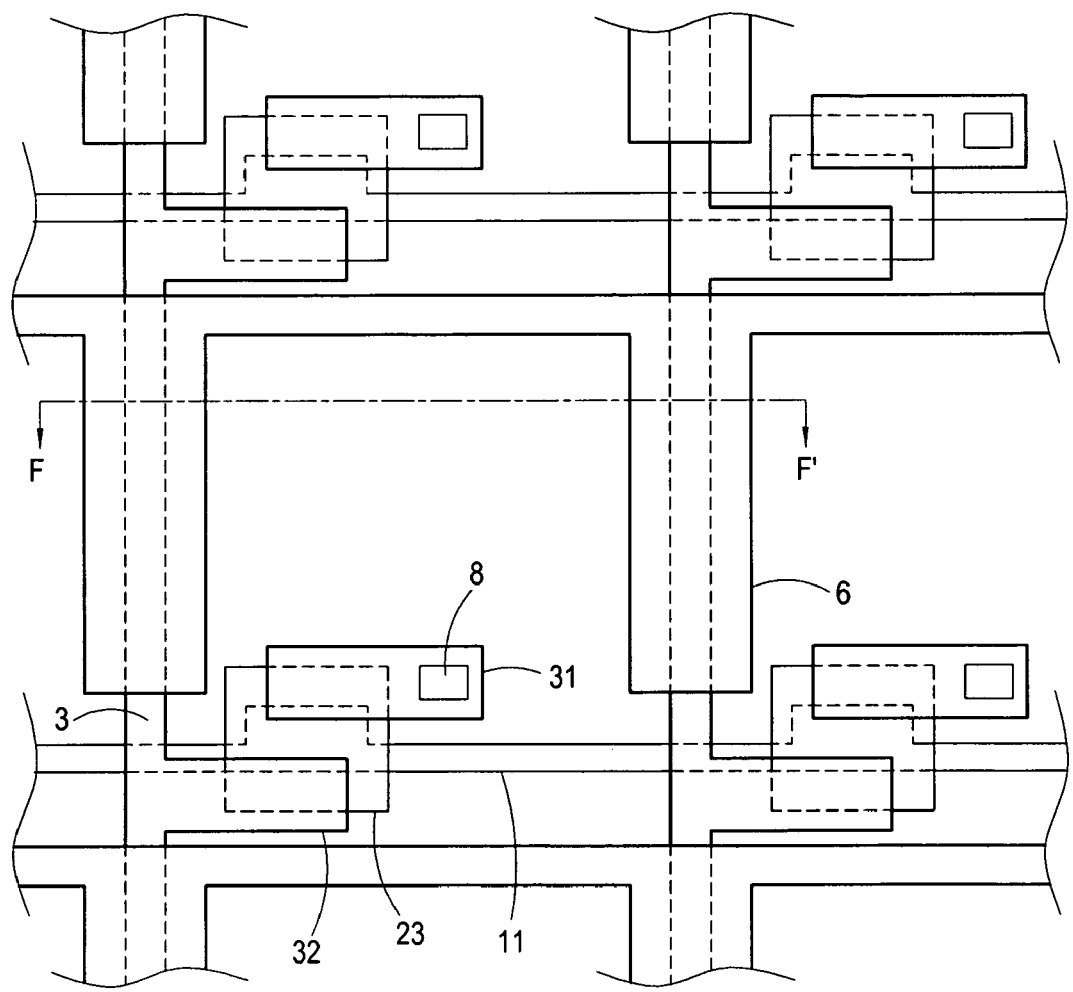
FIG. 13 is a schematic view of a structural layout of the present invention.
Figure 14:
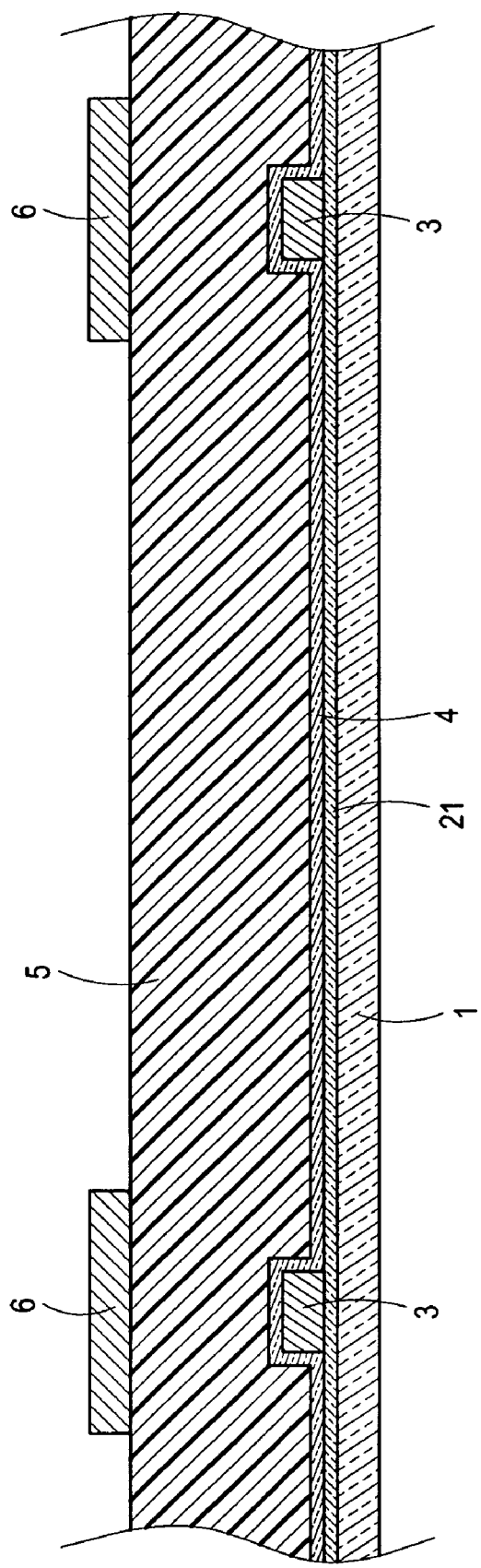
FIG. 14 is a cross-sectional view of Section F-F' as depicted in FIG. 13.

After the organic planarized layer 5 is coated and the contact hole 8 is formed, a third metal conductive layer is plated onto the organic insulating layer 5 by a splattering process to produce the pattern of the common electrode 6 (Vcom) required for the pixels (FIG. 13 shows its structural layout and FIG. 14 shows the cross-sectional view of the structure at Section F-F' as depicted in FIG. 13).

Figure 15:
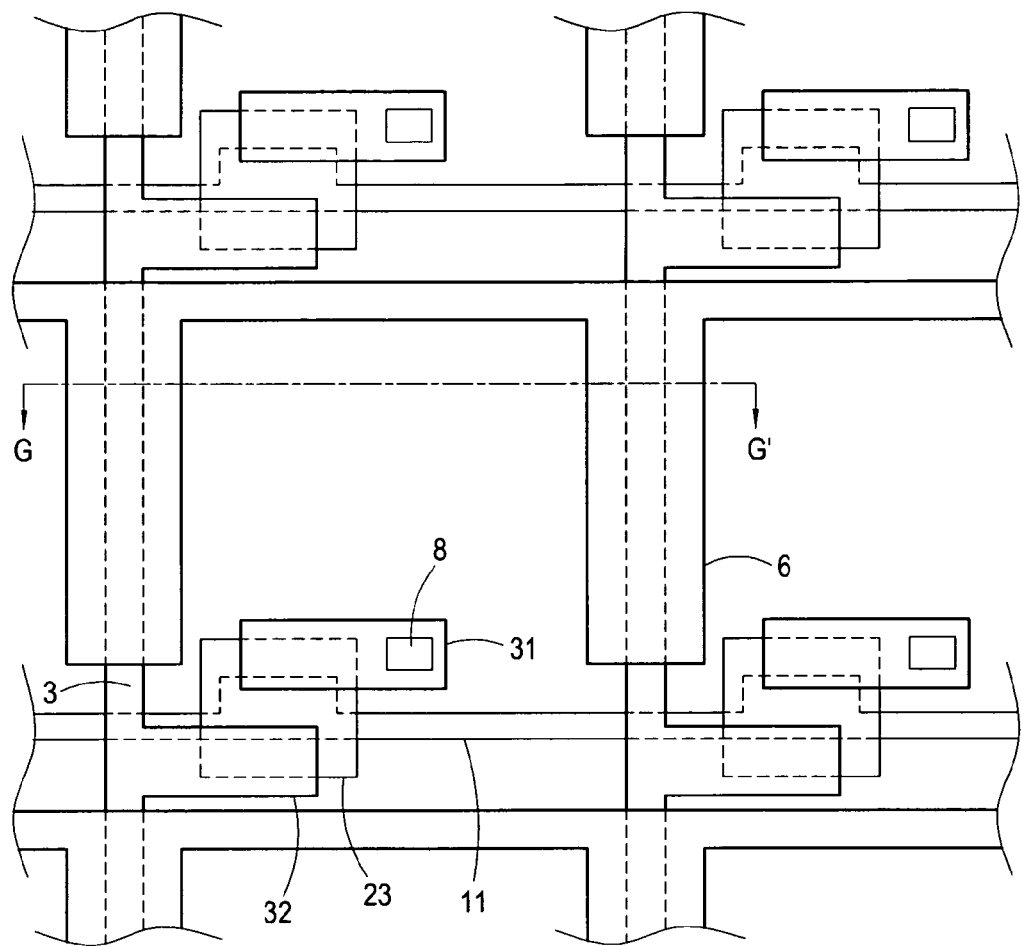
FIG. 15 is a schematic view of a structural layout of the present invention.
Figure 16:
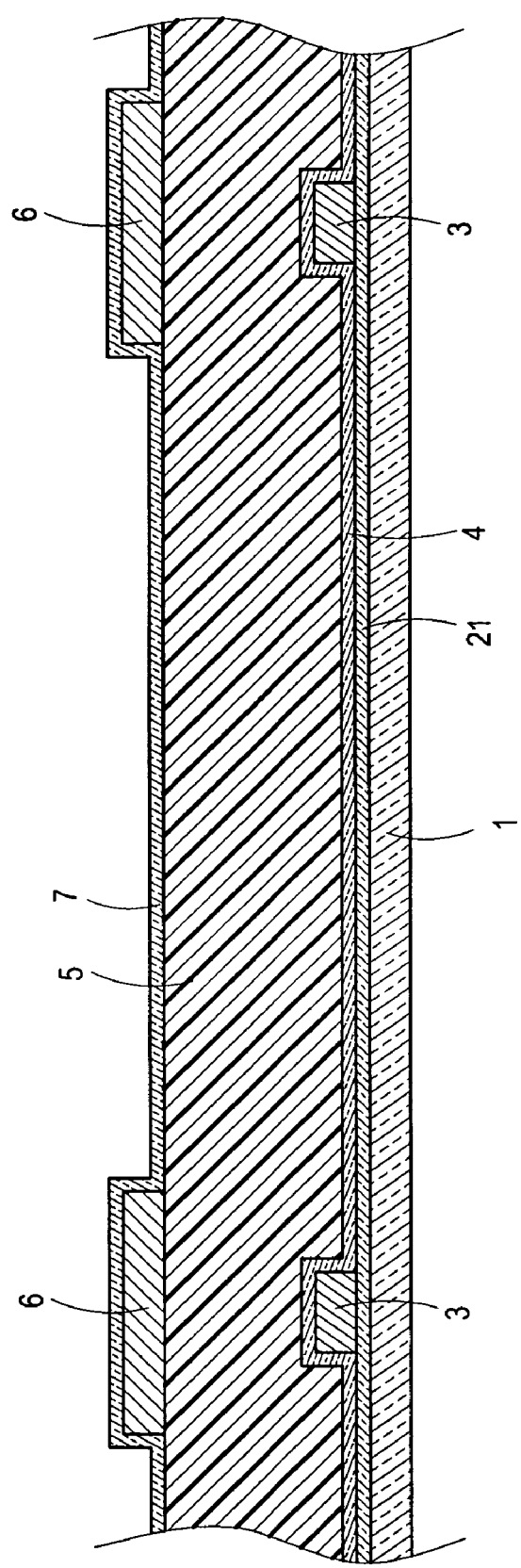
FIG. 16 is a cross-sectional view of Section G-G' as depicted in FIG. 15.

After the organic insulating layer 5 and the common electrode (Vcom) 6 are formed, a thin film process is applied on the surfaces of the organic insulating layer 5 and the common electrode (Vcom) 6 to deposit a passivation layer 7 by the chemical vapor deposition process (FIG. 15 shows its structural layout and FIG. 16 shows the cross-sectional view of its structure at Section G-G' as depicted in FIG. 15), wherein the passivation layer 7 is made of an organic material or an inorganic material.

Figure 17:
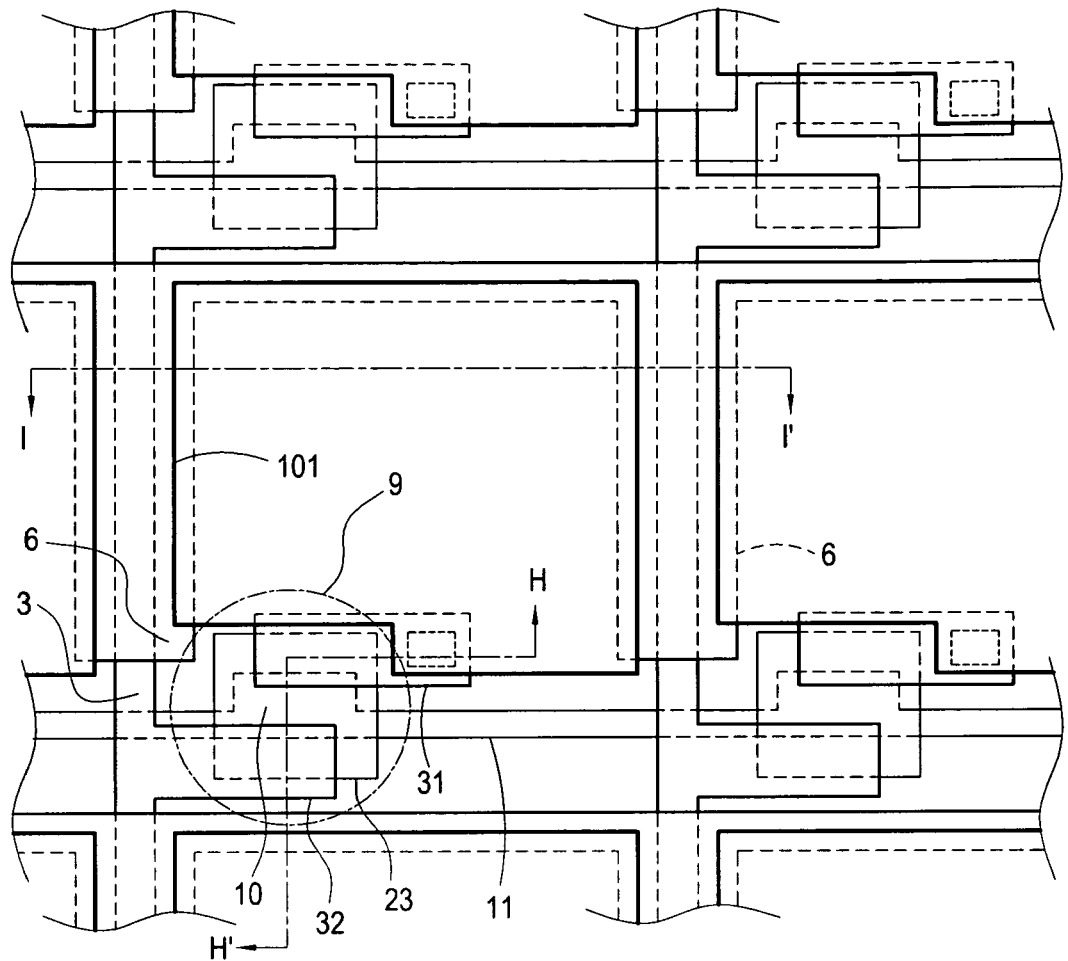
FIG. 17 is a schematic view of a structural layout of the present invention.
Figure 18:
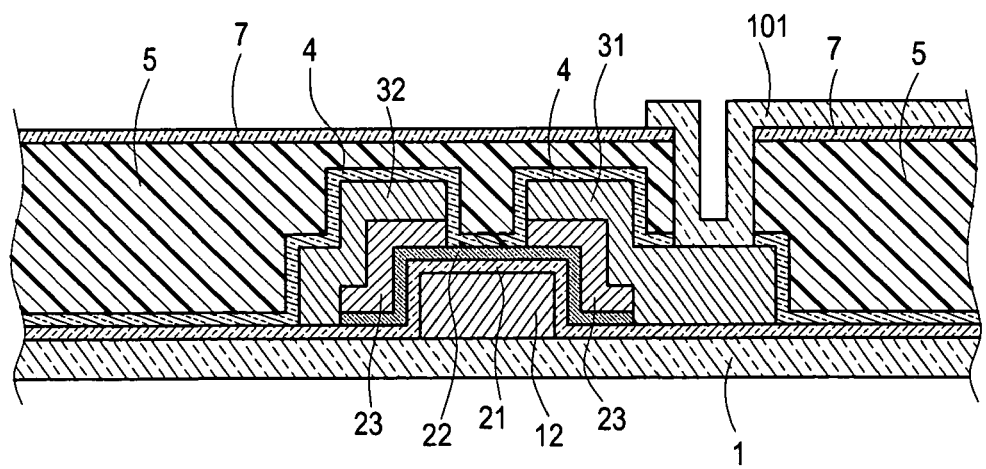
FIG. 18 is a cross-sectional view of Section H-H' as depicted in FIG. 17.
Figure 19:
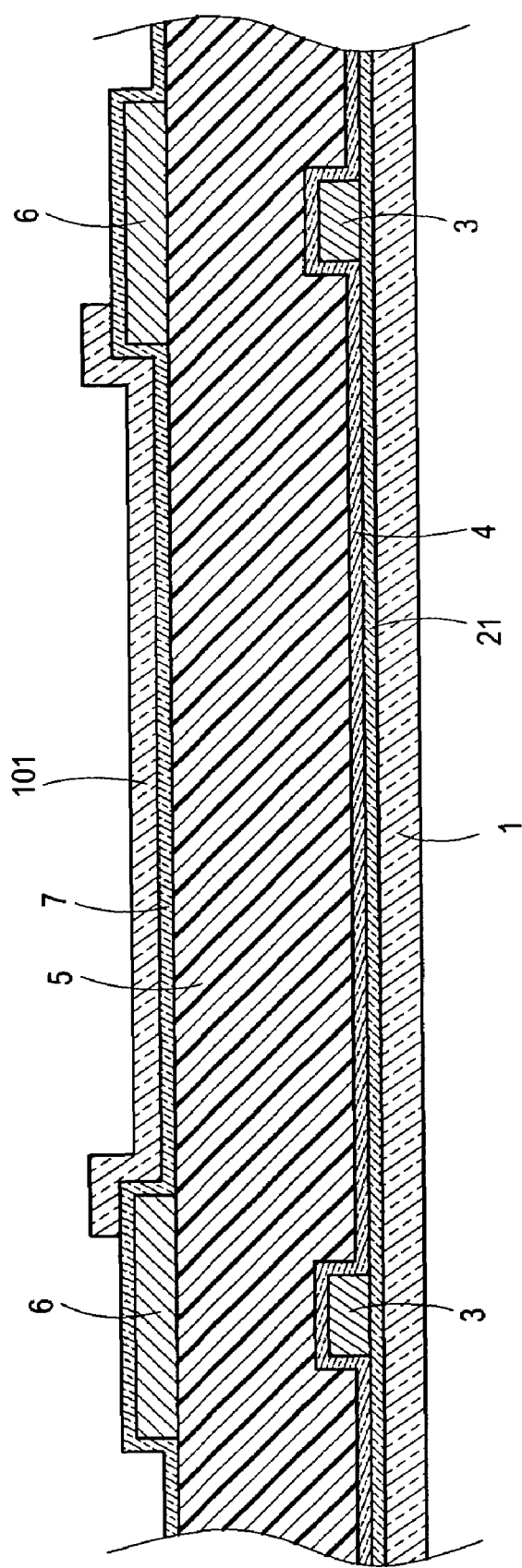
FIG. 19 is a cross-sectional view of Section I-I' as depicted in FIG. 17.

Further, the passivation layer 7 covered on the contact hole 8 is removed, and a transparent conductive layer is plated onto the passivation layer 7 by a splattering process to produce a pixel electrode 101 (as shown in FIGS. 17 to 19), and the transparent conductive layer is made of a transparent material such as indium tin oxide (ITO) or indium zinc oxide (IZO).

Finally, the pattern of the pixel region is formed by a yellow light process to complete the manufacturing procedure of the pixel structure.

The essence of the present invention resides on that the organic insulating layer 5 and the second insulating layer 4 of the pixel structure are provided for lowering the parasitic capacitance of the data signal line 3 and the common electrode 6 and between the data signal line 3 and the common electrode 6. The passivation layer 7 included between the common electrode 6 and the pixel electrode 101 serves as a storage capacitor for the pixels, while the opaque characteristic of the third metal conductive layer can prevent air leaks and shield extra light of the backlight module in the LCD, so that the light sources between pixels will not interfere with each other to improve the display contrast.

In summation of the description above, the key point of the invention resides on that after the second metal conductive layer is patterned, the second insulating layer 4 and organic insulating layer 5 are coated onto the second metal conductive layer, and then the common electrode (Vcom) 6 is made from the third metal conductive layer, and such pixel design employs the second insulating layer 4 and organic insulating layer 5 to lower the parasitic capacitance of the data signal line 3 and the common electrode (Vcom) 6, so as to avoid a crosstalk. Therefore, the common electrode (Vcom) 6 can jump wire over the data signal line 3, and such design definitely can improve the aperture ratio of the pixels and reduce the power loss required for enhancing the brightness of the backlight module and improve product competitiveness.

The present invention are illustrated with reference to the preferred embodiment and not intended to limit the patent scope of the present invention. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A method for producing a pixel structure of a thin film transistor liquid crystal display, comprising:
    (a) preparing a substrate;
    (b) coating a first metal conductive material on a surface of the substrate to produce a first metal conductive layer, and the first metal conductive layer forms a gate electrode of a thin film transistor structure and a scan signal line of a pixel;
    (c) coating a first insulating layer and a semiconductor layer onto a surface of the first metal conductive layer;
    (d) conducting a pattern process for the semiconductor layer, and coating a second metal conductive layer onto a surface of the semiconductor layer, and conducting the pattern process for the second metal conductive layer to produce a drain electrode and a source electrode of the thin film transistor structure;
    (e) coating at least one second insulating layer onto a surface of the second metal conductive layer by a thin film process, and then coating an organic insulating layer onto a surface of the second insulating layer during the thin film process;
    (f) coating a third metal conductive layer onto a surface of the organic insulating layer and forming a pattern of a common electrode required by the pixel, and then coating a passivation layer onto a surface of the third metal conductive layer, and forming a contact hole;
    (g) forming a transparent conductive layer, and producing a pattern of a pixel electrode by the pattern process, and the pixel electrode is electrically connected to the source electrode of the thin film transistor structure through the contact hole, the pixel electrode is insulated from the common electrode, and the passivation layer between the common electrode and the pixel electrode serves as a storage capacitor for the pixel.

2. The method for producing a pixel structure of a thin film transistor liquid crystal display of claim 1, wherein the substrate is made of a hard material (such as glass) or a soft material (such as plastics).

3. The method for producing a pixel structure of a thin film transistor liquid crystal display of claim 1, wherein the first metal conductive layer is made of one selected from a collection of molybdenum (Mo), tantalum (Ta), chromium (Cr), tungsten (W), aluminum, and aluminum alloy, or any combination of the above, or made of a multilayer as needed.

4. The method for producing a pixel structure of a thin film transistor liquid crystal display of claim 1, wherein the film formation for the first insulating layer and the semiconductor layer is conducted successively by a plasma enhanced chemical vapor deposition (PECVD).

5. The method for producing a pixel structure of a thin film transistor liquid crystal display of claim 4, wherein the semiconductor layer includes a hydrogenated amorphous silicon (a-Si:H) intrinsic layer and an n+Si ohmic contact film.

6. The method for producing a pixel structure of a thin film transistor liquid crystal display of claim 1, wherein the second metal conductive layer forms a data signal line.

7. The method for producing a pixel structure of a thin film transistor liquid crystal display of claim 1, wherein the pixel electrode is made of an indium tin oxide (ITO) material.

8. The method for producing a pixel structure of a thin film transistor liquid crystal display of claim 1, wherein the passivation layer is made of an organic material or an inorganic material.

* * * * *